United States Patent [19]

Behr et al.

[11] Patent Number: 4,959,328

[45] Date of Patent: Sep. 25, 1990

[54] METHOD FOR MANUFACTURING A SEMICONDUCTOR COMPONENT CONTACTABLE ON BOTH SIDES

[75] Inventors: Wolfgang Behr, Thalfingen; Johann-Friedrich Luy; Karl Strohm, both of Ulm, all of Fed. Rep. of Germany

[73] Assignee: Licentia Patent-Verwaltungs-GmbH, Frankfurt am Main, Fed. Rep. of Germany

[21] Appl. No.: 199,922

[22] Filed: May 27, 1988

[30] Foreign Application Priority Data

Jun. 4, 1987 [DE] Fed. Rep. of Germany ....... 3718683

[51] Int. Cl.$^5$ .................... H01L 21/20; H01L 21/329
[52] U.S. Cl. ........................................ 437/86; 437/24; 437/906
[58] Field of Search ..................... 437/228, 906, 86, 24

[56] References Cited

FOREIGN PATENT DOCUMENTS

| 0029334 | 5/1981 | European Pat. Off. . |
| 0167948 | 1/1986 | European Pat. Off. . |
| 3425063 | 2/1986 | Fed. Rep. of Germany . |

OTHER PUBLICATIONS

Rhee et al. "Integral Heat-Sink IMPATT Diodes Fabricated Using p+ Etch Stop," Proc. IEEE vol. 61, No. 3, pp. 385–386 Mar. 1973.

Johann-Friedrich Luy et al., Si-MBE Made 90 GHz Double Drift IMPATT Diodes, IEEE Trans. Electron Dev., vol. ED-34, No. 5 (May 1987).

B. Bayraktaroglu et al, "A GaAs Distributed IMPATT Diode Amplifier", IEEE Electron Letters, vol. ED-L-5, No. 11, Nov. 1984, pp. 466–467.

*Primary Examiner*—Olik Chaudhuri
*Assistant Examiner*—George Fourson
*Attorney, Agent, or Firm*—Spencer & Frank

[57] ABSTRACT

A method for manufacturing semiconductor components contactable on both sides, in particular IMPATT diodes. The active silicon layers of the IMPATT diode are grown onto a silicon substrate. The first silicon layer grown onto the silicon substrate has a high boron/germanium doping level and acts as an etch atop layer when the substrate is removed. The boron/germanium doping of the first silicon layer compensates for the mechanical stress in the silicon layer generated by the boron doping.

7 Claims, No Drawings

METHOD FOR MANUFACTURING A SEMICONDUCTOR COMPONENT CONTACTABLE ON BOTH SIDES

BACKGROUND OF THE INVENTION

The invention relates to a method for manufacturing a semiconductor component contactable on both sides where a semiconductor layer series or sequence corresponding to the layer semiconductor component is grown onto a semiconductor substrate.

The invention is applicable in particular for semiconductor components designed as IMPATT diodes. Semiconductor components of this type are used in electrical engineering, particularly for the GHz range. The manufacture of double-drift IMPATT diodes is described in the publication of J. F. Luy et al., IEEE Trans. Electron Dev., Vol. ED-34, No. 5, 1987. The active silicon layers are grown epitaxially onto an $n^+$-doped silicon substrate.

A metallization layer is deposited onto the top semiconductor layer as a first contact layer. Then the underside of the $n^+$-doped silicon substrate is polished plane-parallel to 1 $\mu$m and etched to a thickness of less than 10 $\mu$m with a dilute solution of KOH. The thickness of the etched silicon substrate is determined on the basis of the etching time and by manual re-etching. A further metallization layer is deposited onto the thin $n^+$-doped substrate layer to form the second contact layer of the IMPATT diode. The impatt diode is structured with well known photosensitive resist and etching processes and positioned on a heat sink by bonding techniques.

A manufacturing process of this type has the drawback that the substrate surface has to be polished plane-parallel prior to etching of the substrate and that the reduced-thickness substrate has to be re-etched manually to achieve the required substrate thickness. In addition, further measuring processes are necessary to check whether the substrate does have the requisite thickness.

SUMMARY OF THE INVENTION

The object underlying the invention is to indicate a simple-to-manufacture and inexpensive method of this type which permits reliable manufacture of the semiconductor component in industrial series production conditions in particular. According to the invention, a series of semiconductor layers having a first $p^+$-doped semiconductor layer is grown onto the semiconductor substrate. The semiconductor substrate is then removed completely.

The advantage of the invention is that an etch stop layer is generated by suitable doping of the first semiconductor layer grown onto the substrate. When the substrate is etched, etching stops automatically at this first semiconductor layer. The substrate is completely removed in an advantageous manner, and the expensive polishing, measuring and etching processes for generating a thinner substrate can be dispensed with.

DESCRIPTION OF THE PREFERRED EMBODIMENTS

A first semiconductor layer of $p^+$-doped silicon is epitaxially grown onto a n-doped silicon substrate.

The silicon layer is doped with boron and has a charge carrier concentration of more than $7 \cdot 10^{19}$ cm$^{-3}$. The layer thickness of the boron-doped silicon layer is approximately 2.0 $\mu$m. Further silicon layers are grown onto this first semiconductor layer in such a way that IMPATT diodes, for example, can be manufactured.

Onto the first $p^+$-doped silicon layer are grown, for example, an n-doped silicon layer and an $n^+$-doped silicon layer for generation of a $p^+nn^+$ structure (single drift IMPATT diode), or a p-doped silicon layer, an n-doped silicon layer and an $n^+$-doped silicon layer for generation of a $p^+pnn^+$ structure (double drift IMPATT diode), or a p-doped silicon layer, a thin $n^+$-doped silicon layer, an n-doped silicon layer and an $n^+$-doped silicon layer for generation of a $p^+pn^+nn^+$ structure (Quasi-Read double drift IMPATT diode).

The semiconductor layers can be made by the molecular-beam epitaxy method.

The layer thicknesses of the p and n layers are between 0.2 $\mu$m and 0.35 $\mu$m. The thin $n^+$-doped silicon layer of the Quasi-Read double drift diode have a layer thickness of about 0.05 $\mu$m. Gallium is used for p-doping of the silicon layers with a charge carrier concentration of approx. $2 \cdot 10^{17}$ cm$^{-3}$. The n- and $n^+$-doping of the silicon layers is achieved with antimony having a charge carrier concentration of $2 \cdot 10^{17}$ cm$^{-3}$ and $2 \cdot 10^{19}$ cm$^{-3}$, respectively.

A first metallization layer is deposited onto the top $n^+$-doped silicon layer of the respective IMPATT diode structure, this metallization layer comprising a 0.1 $\mu$m thick adhesion-promoting layer of titanium and a 0.3 $\mu$m thick gold layer.

The silicon substrate is then completely removed with an anisotropic etch, e.g. dilute KOH solution. The first $p^+$-doped silicon layer of the IMPATT diode structure acts as an anti-etching layer. Silicon layers having a high boron doping concentration in excess of $7 \cdot 10^{19}$ charge carriers per cm$^3$ have an extremely low etching rate for certain anisotropic etches such as, for example, dilute KOH solutions. Since boron has a lower covalency radius than silicon, the high boron doping concentration does have the drawback that mechanical stresses occur in the boron-doped layer.

In addition, the high boron doping of the silicon layer has the disadvantageous effect of producing lattice errors on the border layer to the substrate and in the subsequent semiconductor layers.

As described in DE-OS No. 34 25 063, these drawbacks are avoided by doping the first $p^+$-doped silicon layer with boron (B) and germanium (Ge).

Germanium has a greater covalency radius that silicon and can therefore compensate stresses generated by boron in the silicon layer. It is therefore advantageous to dope the first silicon layer of the IMPATT diode structure with boron and germanium. The layer thickness of this B/Ge-doped silicon layer is for example 2 $\mu$m and has a charge carrier concentration of approx. $1.3 \cdot 10^{20}$ 8/cm$^3$ and $1.4 \cdot 10^{21}$ Ge/cm$^3$.

The boron and germanium doping of the first silicon layer has a favourable effect on subsequent layer growth. The high germanium doping level prevents the occurrence of lattice errors and the subsequent silicon layers can grow defectfree.

Thanks to the high doping level of boron and germanium the first silicon layer of the impatt diode structure has a very low etching rate and etching stops automatically at the B/Ge-doped silicon layer when the substrate is etched. A second metallization layer comprising 0.1 $\mu$m of titanium and 0.3 $\mu$m of gold is deposited on the first $p^+$-doped layer. Well known photosensitive resist and etching processes are then used to form an IMPATT diode contactable via the first and second metallization layers, this IMPATT diode being positioned on a heat sink with the aid of bonding techniques.

The invention is not confined to the described embodiment, but is suitable, with due alterations, for the manufacture of other semiconductor components.

What is claimed is:

1. A method of manufacturing a semiconductor component which is contacted on both sides comprising the steps of:

providing a silicon substrate;

epitaxially growing a sequence of differently doped silicon semiconductor layers, corresponding to the layer sequence of the semiconductor component, on a surface of said substrate with the first silicon semiconductor layer of said sequence directly grown on said surface of said substrate being a p+-doped silicon layer which is doped with boron, of a concentration in excess of $7 \times 10^{19}$ cm$^{-3}$, and germanium of a concentration sufficient to compensate for mechanical stresses generated by the boron;

removing said substrate by etching;

contacting said first layer; and, contacting the last layer of said sequence of layers.

2. A method according to claim 1, wherein an anisotropic etch is used to remove the silicon semiconductor substrate.

3. A method according to claim 1, wherein the semiconductor component is an IMPATT diode.

4. A method as defined in claim 1 wherein said boron concentration is approximately $1.3 \times 10^{20}$ atoms/cm$^3$ and said germanium concentration is approximately $1.4 \times 10^{21}$ atoms/cm$^3$.

5. A method as defined in claim 1 wherein: said semiconductor component is a doubled drift IMPATT diode; said step of epitaxially growing includes sequentially growing a p-doped silicon layer, an n-doped silicon layer and an n+-doped silicon layer on said first p+-doped silicon layer; and said step of contacting the last layer includes contacting said n+-doped silicon layer.

6. A method as defined in claim 1 wherein: said semiconductor component is a Quasi-Read double drift IMPATT diode; said step of epitaxially growing includes sequentially growing a p-doped silicon layer, a relatively thin n+-doped silicon layer, an n-doped silicon layer and an n+-doped silicon layer on said first p+-doped silicon layer; and said step of contacting the last layer includes contacting said n+-doped silicon layer.

7. A method as defined in claim 1 wherein said step of contacting the last layer of said layer sequences is carried out prior to said step of removing, and said step of contacting said first layer is carried out after said step of removing.

* * * * *